United States Patent [19]

Wang et al.

[11] 4,011,574
[45] Mar. 8, 1977

[54] JUNCTION ARRAYS FOR SUPERCONDUCTING AND NONSUPERCONDUCTING APPLICATION

[75] Inventors: Shyh Wang, El Cerrito; Won-Tien Tsang, Albany, both of Calif.

[73] Assignee: The United States of America as represented by the Secretary of the Air Force, Washington, D.C.

[22] Filed: Aug. 12, 1975

[21] Appl. No.: 604,280

[52] U.S. Cl. .................................. 357/6; 357/4; 357/5

[51] Int. Cl.² ................ H01L 49/02; H01L 39/22

[58] Field of Search ............... 357/5, 6, 4; 307/306

[56] References Cited

UNITED STATES PATENTS

| | | | |
|---|---|---|---|
| 3,296,459 | 3/1967 | Frankel | 307/88.5 |
| 3,549,991 | 12/1970 | Silver | 324/43 |
| 3,705,393 | 12/1972 | Anacker | 340/173.1 |

OTHER PUBLICATIONS

Lum et al., *Journal of Applied Physics*, vol. 46, No. 7, pp. 3216–3218, July 1975.
Kittel, *Introduction to Solid State Physics*, 4th Edition, 1971, John Wiley & Sons, N.Y., p. 402.

*Primary Examiner*—Martin H. Edlow
*Attorney, Agent, or Firm*—Joseph E. Rusz; Henry S. Miller

[57] ABSTRACT

An article and method for fabricating one and two dimensional arrays of superconducting and normal junctions by depositing metal films on photoresist gratings. In one mode superconducting Josephson junction arrays of the Dayem bridge type are fabricated by scratching a groove across the grating with a sharp diamond point.

6 Claims, 3 Drawing Figures

JUNCTION ARRAYS FOR SUPERCONDUCTING AND NONSUPERCONDUCTING APPLICATION

STATEMENT OF GOVERNMENT INTEREST

The invention described herein may be manufactured and used by or for the Government for governmental purposes without the payment of any royalty thereon.

BACKGROUND OF THE INVENTION

This invention relates generally to junction devices and more particularly to junction arrays for superconducting and nonsuperconducting applications.

Recent technological advances have made it possible to form very fine diffraction gratings on photoresists by optical interference of the two laser beams. These advances have found limited application in thin-film distributed feedback lasers and microwave acoustic waves. Related advances, involving fabrication of gratings with positive photo-resists in which the exposing and developing processes are carried out simultaneously, create gratings with relatively deep grooves and sharp ridges.

Most interest in junction arrays concerns their application to the superconducting state. Super-current has been known and investigated for some time, however the discovery of the Josephson effect has stimulated interest as of late. The effect relates to current flow through a discontinuance separating two superconductive regions. Termed a, "weak link" the region of discontinuance is anything which separates two superconductive regions and which is not itself a superconductor. This would include a potential superconductor not in a superconductive state as are the connecting superconductive regions, but which nevertheless transfers current therebetween. The weak link may be, for example, a layer of insulator, or a layer of non-superconductive metal or semiconductor material or several layers, some of which may be superconductive (see "Superconductivity", R. D. Parks, Volumes 1 and 2, Marcel Dekker Inc. New York 1969).

Both theoretical and experimental results have shown that multiple Josephson junctions can be made to self-synchronize and enter a "super-radiant" state by interaction with an electromagnetic cavity or an external rf electromagnetic field. Consequently, the radiation generated by an array of Josephson junctions should increase as $M^2$, where M is the number of junctions in the array. Likewise, when the junctions are used as detectors, the detection sensitivity of an array will also increase as $M^2$.

Although multiple Josephson junctions have been made previously with granular films, compressed aluminum powder and Nobium balls the physical dimension of the junctions in each case is nonuniform and the spacing between junctions is uncontrollable. The devices presented hereinafter in contrast to the known art are carefully controlled in spacing and junction dimension.

For non-superconducting junctions, the use of metal to metal point contact as detector, mixer and generator of infrared radiation is seen as a substantial advancement in the art. It is further seen where the use of an array will now only improve the sensitivity but also give rise to directivity of point-contact junctions. The ability of fabricating uniformly spaced junctions for point-contact applications will result in a substantial reduction in size and cost of currently available devices and the discovery of uses as well.

SUMMARY OF THE INVENTION

The invention involves a new and innovative article and method of fabricating the article. Among the various forms of Josephson junction, the Dayem bridge is one that is more easily fabricated. To assemble an array of Dayem bridges, as broadly described hereinbefore, it is possible to coat a photoresist grating with a superconducting film and scratch a light groove across the grating with a sharp diamond point. The scratching technique is used successfully to remove a narrow strip of superconducting film in making semimetal barrier Josephson junctions. In the process of making the Dayem-bridge array, the scratch does not react to the bottom of the grooves of grating. As a result, a microbridge is formed in each groove connecting the two superconducting films on either side of the scratch. Where the grating period is capable of being as small as 0.11 $\mu$m with a depth of 500 Å, the width of the microbridges and the spacing between them can be extremely small.

The photoresist, for example Shipley AZ-1305J must have the desirable qualities of good adherence to the metal films, the appropriate hardness to provide a clean cut scratch when matched with particular stylis. Also the resist must exhibit high elasticity to serve as a tension buffer between the superconducting film and the glass substrate. Hence, the delicate micro-bridges are well preserved and no stripping or cracking occurs between the metal-resist or the resist-substrate during thermal cycling.

The scoring in this process may be performed by several techniques. In one method the metal coated resist is mounted on a platform and delicate counterbalanced arm pivoted near one end and having a diamond point protruding appropriately at the other is mounted adjacent thereto. The diamond point is drawn across the grating, scoring the resist and creating the the Dayem bridge. The depth of the score is controlled by the adjustment to the counterbalanced arm.

Junction arrays can also be fabricated with the scoring process if the grating is simply mounted on a platform having a micro-translation in the appropriate directions. In another form regular patterns may be formed by using the technique with a computer controlled scanning electron microscope.

Arrays of non-superconducting (normal) junctions may also be fabricated from similar techniques. Arrays of normal junctions can be used to improve the detection sensitivity of metal point-contact junctions. These aforesaid junctions functions optimally with a small metal wire antenna attached to the junction. By utilizing a two-dimensional grating with two sets of gratings oblique or orthogonal to each other, a two-dimensional array of pointed metal-coated photo resist posts is provided rather than the usual rows of ridges expected.

It is therefore an object of the invention to provide a new and improved superconducting junction device.

It is another object of the invention to provide a new and improved process for fabricating junction devices.

It is a further object of the invention to provide a new and improved non-superconducting junction device.

It is still another object of the invention to provide a new and improved junction device that is economical to produce and utilizes conventional currently available components that lend themselves to standard mass production manufacturing techniques.

It is still a further object of the invention to provide a new and improved superconducting function array device.

It is another object of the invention to provide a new and improved superconducting Josephson junction array device.

It is another object of the invention to provide a new and improved metal point-contact junction device.

DESCRIPTION OF THE PREFERRED EMBODIMENT

Figure 1:
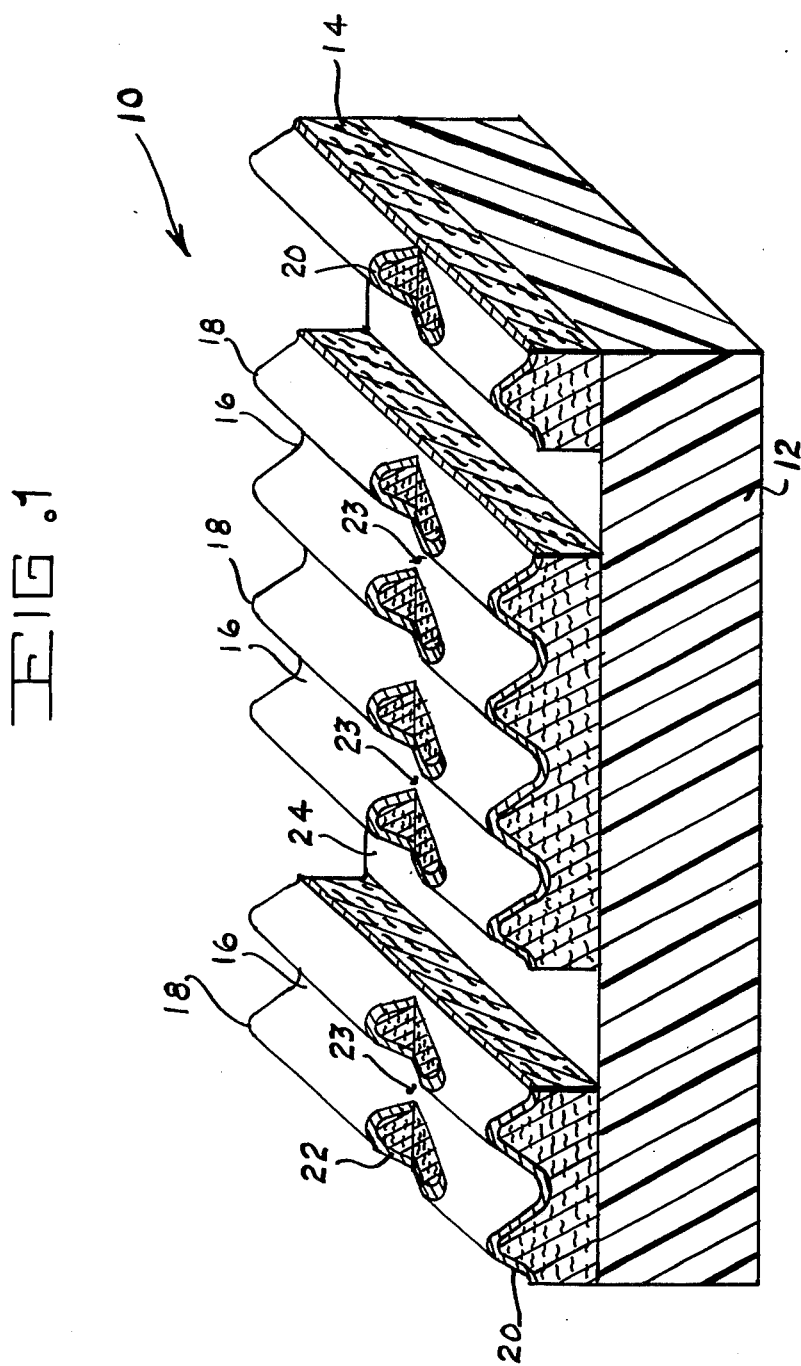
FIG. 1 is a perspective view of a typical Dayem bridge type junction.

Referring now to FIG. 1 there is shown generally at 10 an array of Josephson junctions of the Dayem bridge type especially fabricated for superconducting operation. A substrate 12 of glass or other appropriate material has applied thereto, a photoresist material 14. After application of the resist material, the combination is subjected to one of the aforementioned processes for forming diffraction gratings therein (i.e. laser optical interference and the simultaneous exposure and development techniques). The grating consists of grooves 16 and ridges 18. Utilizing the laser techniques allows the period of the grating to be extremely small and hence the overall array to occupy a small volume.

The grating created in the resist, atop the substrate is subsequently covered with a metallic film 20. The film should be appropriate to the intended use, as where the device is intended for superconductive operation.

The composite is then scored transversely to longitudinal axis of the ridges as shown at 22. The score is of sufficient depth to cut clearly through the metallic film 20 and resist 14, leaving the weak link areas 23 where current may flow between the two superconducting areas. Heavier, score marks may be made, isolating areas of an array as shown at 24 where the film and resist are removed to the substrate 12.

One particularly successful method of fabricating an array has been to score the film resist with a diamond point. By utilizing various weights on the point, it is possible to create an almost infinite variety of combinations in array structure. It should be understood of course that the scoring process must be controlled by very fine instruments such as a computer controlled scoring electron microscope.

Figure 2:
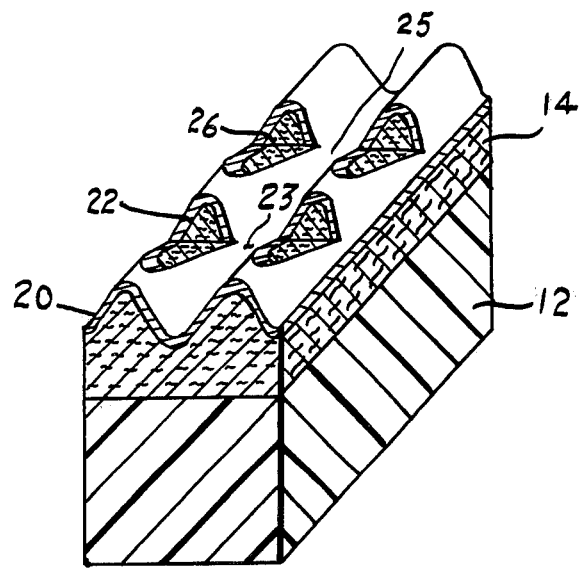
FIG. 2 is a perspective view of a point contact junction.

Concerning FIG. 2, there is shown a section of a large array having a pair of score marks 22 and 26 and likewise a pair of weak links or Dayem bridges 23 and 25. Utilizing the appropriate size materials and fabricating equipment an array could be constructed of substantial dimensions.

Figure 3:
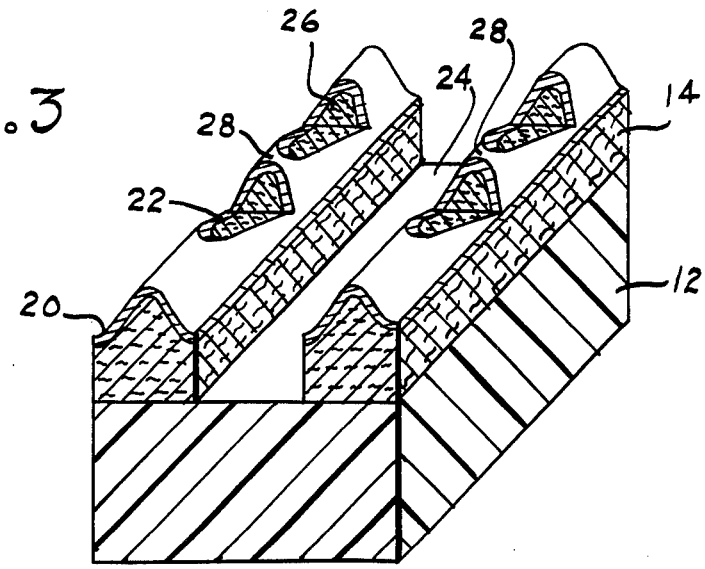
FIG. 3 is a perspective view of a section of Josephson array.

In FIG. 3, there is shown a partial array of non-superconducting or "normal" junctions. The junctions are isolated on the substrate 12 and form in effect a metal coated post 28 of a point contact junction. The need for affixing a very small wire antenna is thus eliminated. A two-dimensional array of point contact junctions can be formed by pressing these metal-coated parts against a metallic flat surface.

Having thus described my invention with reference to particular embodiments, it will be understood to those skilled in the art that the invention is capable of a variety of alternative embodiments within the spirit and scope of the appended claims.

What is claimed is:

1. A superconduction junction array device comprising: a substrate base; a photoresist material covering one side of said base, said resist having a series of closely spaced, parallel groves and ridges on its open face; a superconducting metallic coating covering said photo-resist material, and a first score mark transverse to said ridges and cutting through one ridge removing the said metallic coating from the ridge but not from the groove adjacent thereto.

2. A superconduction junction array semiconductor device according to claim 1 further including a score mark cutting through a plurality of ridges.

3. A superconduction junction array semiconductor device according to claim 2 further including a plurality of parallel score marks cutting through a plurality of ridges.

4. A super-conduction junction array semiconductor device according to claim 1 including, a second score mark parallel to said ridges, cutting through said metallic coating and photoresist.

5. A superconduction junction array semiconductor device according to claim 4 including a plurality of first and second score marks as to form a series of independent semiconductor junction devices on the same substrate.

6. A method of making super-conduction junction array semiconductor devices comprising the steps of: coating a substrate with photo resist material; forming a very fine diffraction grating on the surface of said photo resist by the optical interference of two laser beams; coating the grating surface with a metallic film capable of superconductivity, and scoring the grating, transverse to the direction of the lines in the grating, sufficiently to remove the metal film on the ridges but not from the grooves of the grating.

* * * * *